United States Patent
Hong et al.

(10) Patent No.: US 12,178,110 B2
(45) Date of Patent: Dec. 24, 2024

(54) METHOD FOR MANUFACTURING DISPLAY APPARATUS WHILE MINIMIZING DAMAGE TO THE DISPLAY APPARATUS

(71) Applicant: Samsung Display Co., Ltd., Yongin-si (KR)

(72) Inventors: Kyongho Hong, Yongin-si (KR); Donghyeon Kim, Yongin-si (KR); Byunghun Sung, Yongin-si (KR); Jungseob Lee, Yongin-si (KR); Jinwon Chang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 270 days.

(21) Appl. No.: 17/386,488

(22) Filed: Jul. 27, 2021

(65) Prior Publication Data

US 2022/0140294 A1     May 5, 2022

(30) Foreign Application Priority Data

Nov. 2, 2020   (KR) .................. 10-2020-0144579

(51) Int. Cl.
*H10K 71/00*     (2023.01)
*H01L 21/683*    (2006.01)

(52) U.S. Cl.
CPC ......... *H10K 71/00* (2023.02); *H01L 21/6838* (2013.01)

(58) Field of Classification Search
CPC ...... H10K 71/00; H10K 71/166; H10K 59/12; H01L 21/6838; H01L 21/6875; H01L 21/68785; H01L 21/68742
See application file for complete search history.

(56) References Cited

U.S. PATENT DOCUMENTS

| | | | |
|---|---|---|---|
| 5,643,366 A | 7/1997 | Somekh et al. | |
| 8,388,781 B2 | 3/2013 | Choi et al. | |
| 9,469,093 B2 | 10/2016 | Wada et al. | |
| 9,859,495 B2* | 1/2018 | Kang | B05C 21/005 |
| 10,439,168 B2* | 10/2019 | Ahn | G02F 1/1303 |
| 11,505,861 B2 | 11/2022 | Kaneko et al. | |
| 2006/0252233 A1* | 11/2006 | Honma | H01L 21/67132 438/464 |
| 2011/0074458 A1* | 3/2011 | Di Stefano | G01R 31/2863 324/757.01 |
| 2015/0234296 A1* | 8/2015 | Yagi | H01L 21/67028 355/72 |

(Continued)

FOREIGN PATENT DOCUMENTS

| | | |
|---|---|---|
| JP | 2005-107143 | 4/2005 |
| JP | 6045972 | 12/2016 |

(Continued)

*Primary Examiner* — Caleb E Henry

(74) *Attorney, Agent, or Firm* — KILE PARK REED & HOUTTEMAN PLLC

(57) ABSTRACT

The apparatus for manufacturing a display apparatus includes: a carrier; a support arranged to be spaced apart from the carrier; a driver connected to the support to linearly move the support; and an elastic portion arranged between the driver and the support to provide an elastic force to the support, wherein the support includes: a first surface on which a substrate is to be mounted; and a second surface projecting upward from the first surface to selectively contact the carrier.

9 Claims, 14 Drawing Sheets

(56) References Cited

U.S. PATENT DOCUMENTS

| | | | |
|---|---|---|---|
| 2016/0126049 A1* | 5/2016 | Ahn | H01L 21/68735 |
| | | | 156/60 |
| 2019/0172733 A1* | 6/2019 | Yoshida | H01L 21/02057 |
| 2020/0140989 A1* | 5/2020 | Kim | C23C 14/24 |

FOREIGN PATENT DOCUMENTS

| | | |
|---|---|---|
| KR | 10-0253957 | 5/2000 |
| KR | 10-1292803 | 8/2013 |
| KR | 10-2014-0130576 | 11/2014 |
| KR | 10-2014-0144369 | 12/2014 |
| KR | 10-2018-0011943 | 2/2018 |
| KR | 10-2019-0021428 | 3/2019 |

* cited by examiner

METHOD FOR MANUFACTURING DISPLAY APPARATUS WHILE MINIMIZING DAMAGE TO THE DISPLAY APPARATUS

CROSS-REFERENCE TO RELATED APPLICATION

This application claims priority from and the benefit of Korean Patent Application No. 10-2020-0144579, filed on Nov. 2, 2020, which is hereby incorporated by reference for all purposes as if fully set forth herein.

BACKGROUND

Field

Embodiments of the invention relate generally to display devices, and more specifically, to an apparatus for manufacturing a display apparatus and a method of manufacturing the display apparatus.

Discussion Of The Background

Mobile electronic devices have become widely used. Mobile electronic devices, in addition to small electronic devices, such as mobile phones, tablet personal computers (PCs) have become more broadly used in recent times.

Such mobile electronic devices include display apparatuses to provide visual information to a user, such as an image or a video, in order to support various functions. Recently, as various components for driving a display apparatus have been miniaturized, the importance of a display for an electronic device has continually increased, and a structure to bend a display apparatus that is flat to have a certain angle has been developed.

The display apparatus may include various layers and may include a display substrate that must be moved to form the various layers during manufacture of the display apparatus process.

The above information disclosed in this Background section is only for understanding of the background of the inventive concepts, and, therefore, it may contain information that does not constitute prior art.

SUMMARY

Applicant recognized that the display substrate can be damaged due to various factors due to movement of the substrate during manufacturing process. For example, an excessive force can be applied to the substrate when the substrate is attached to a carrier for movement, especially if the substrate is not in a perfectly flat position, which causes the substrate to be damaged, and thus, defects can occur in the display apparatus.

Apparatus for manufacturing display apparatus constructed according to the principles and implementations of the invention and illustrative methods of manufacturing the same are capable of minimizing damages to a substrate attached to a carrier, and thus minimizing damage to the display apparatus manufactured from the substrate. For example, a first processing unit to attach the substrate onto the carrier may include a mounting portion received in an accommodating portion, an elastic portion, and balance adjusting portion located between the mounting portion and the elastic portion. The mounting portion may include first and second surfaces at different heights due to step difference therebetween such that the second surface of one or more mounting portions may contact the carrier before others to prevent applying an excessive force to the display substrate. Even when the first and second surfaces are arranged at different heights, the mounting portions may stably support the display substrate and minimize or prevent damage to the display substrate.

Additional features of the inventive concepts will be set forth in the description which follows, and in part will be apparent from the description, or may be learned by practice of the inventive concepts.

According to one aspect of the invention, an apparatus for manufacturing a display apparatus, the apparatus includes: a carrier, a support spaced apart from the carrier, a driver connected to the support to linearly move the support, and an elastic portion arranged between the driver and the support to provide an elastic force to the support, wherein the support includes a first surface on which a substrate is to be mounted, and a second surface projecting upwardly from the first surface to selectively contact the carrier.

The apparatus may further include an accommodating portion disposed on the driver and supporting the support to linearly move the support.

The apparatus may further include a guide portion in which the elastic portion is received.

The apparatus may further include a balance adjusting portion disposed between the elastic portion and the support or between the elastic portion and the driver.

A curved portion may be provided on a portion of the balance adjusting portion, the portion contacting the support or the driver.

The driver may include: a driving force generating portion; a connection portion connected to the driving force generating portion; and a supporting portion connected to the connection portion.

The supporting portion may include: a first portion; and a second portion spaced apart from the first supporting portion and supporting the elastic portion.

The support may include a plurality of mounting portions, and the plurality of mounting portions may be spaced apart from each other and support edge portions of a substrate, respectively.

The support may include a mounting portion, the driver may include a driving portion, and the first and second surfaces of the support may include a first mounting portion and a second mounting portion, respectively.

The first and second surfaces of the support may have different heights due to a step difference therebetween.

The curved surface may allow for tilting the support relative to the carrier when the support contacts the carrier.

According to another aspect of the invention, a method of manufacturing a display apparatus using a support having a first surface on which a display substrate is mounted, and a second surface projecting upward from the first surface to selectively contact a carrier for the display substrate, the method includes the steps of: locating a carrier in a chamber, linearly moving the support to position the substrate near the carrier in the chamber, contacting a portion of the support against the carrier, and linearly moving the support such that the substrate contacts the carrier.

The method may further include the step of maintaining a vacuum in the chamber.

The method may further include the step of linearly moving the support relative to an accommodating portion.

The method may further include the step of tilting the support when the support contacts the carrier.

The method may further include the step of positioning an elastic portion between the support and a driver, and positioning a balance adjusting portion contacting the elastic portion between the elastic portion and the support or between the elastic portion and the driver.

The method may further include the step of contacting the support or the driver with a curved surface formed on a portion of the balance adjusting portion, the portion contacting the support or the driver.

The support may include a plurality of mounting portions, and the method may further include the step of connecting the plurality of mounting portions to the driver and to simultaneously move the mounting portions.

When the plurality of mounting portions contact the carrier, one of the plurality of mounting portions may move a first distance and another of the plurality of mounting portions may move a second distance different from the first distance.

The method may further include the step of separating the mounting portion and the substrate from each other by operating the driver.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
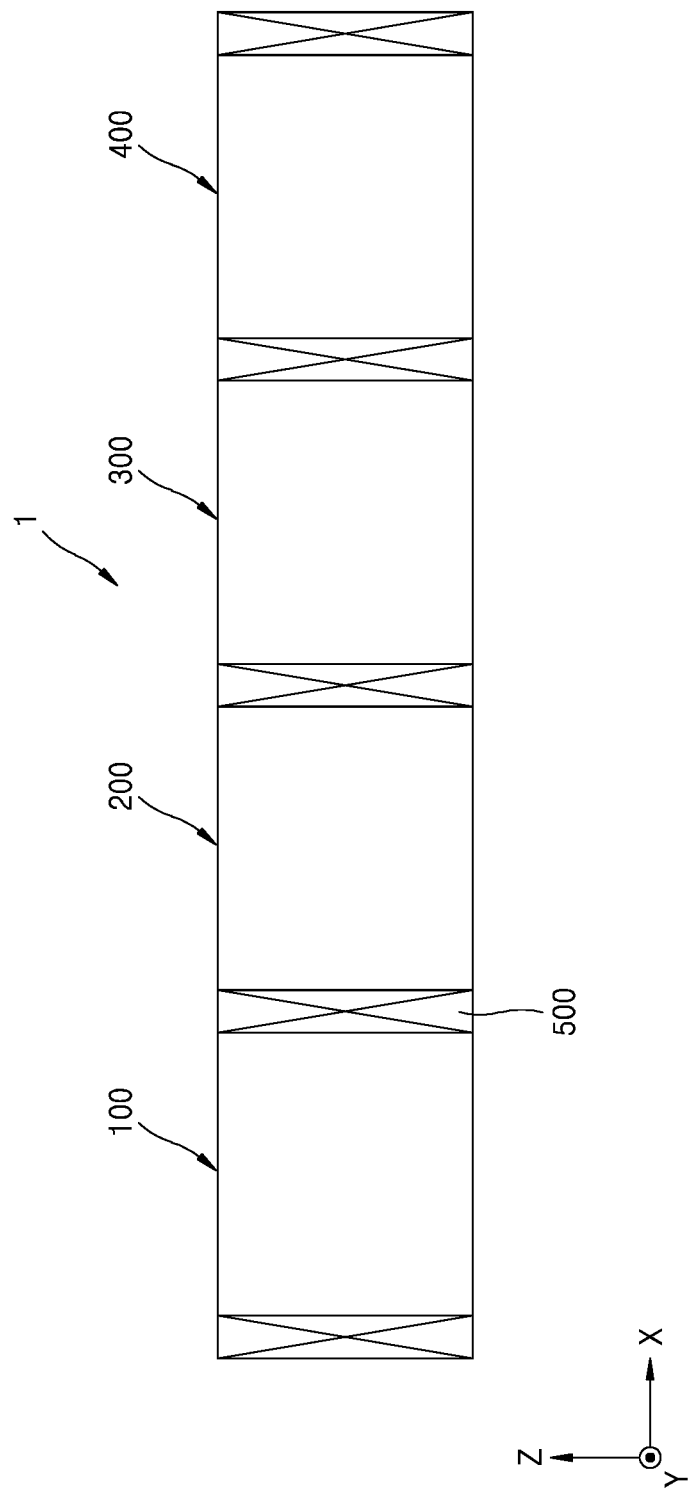
FIG. 1 is a schematic diagram of an embodiment of an apparatus for manufacturing a display apparatus constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic diagram of an embodiment of an apparatus 1 for manufacturing a display apparatus constructed according to the principles of the invention.

Referring to FIG. 1, the apparatus 1 for manufacturing a display apparatus may include a first processing unit 100, a second processing unit 200, a third processing unit 300, and a fourth processing unit 400.

Figure 2:
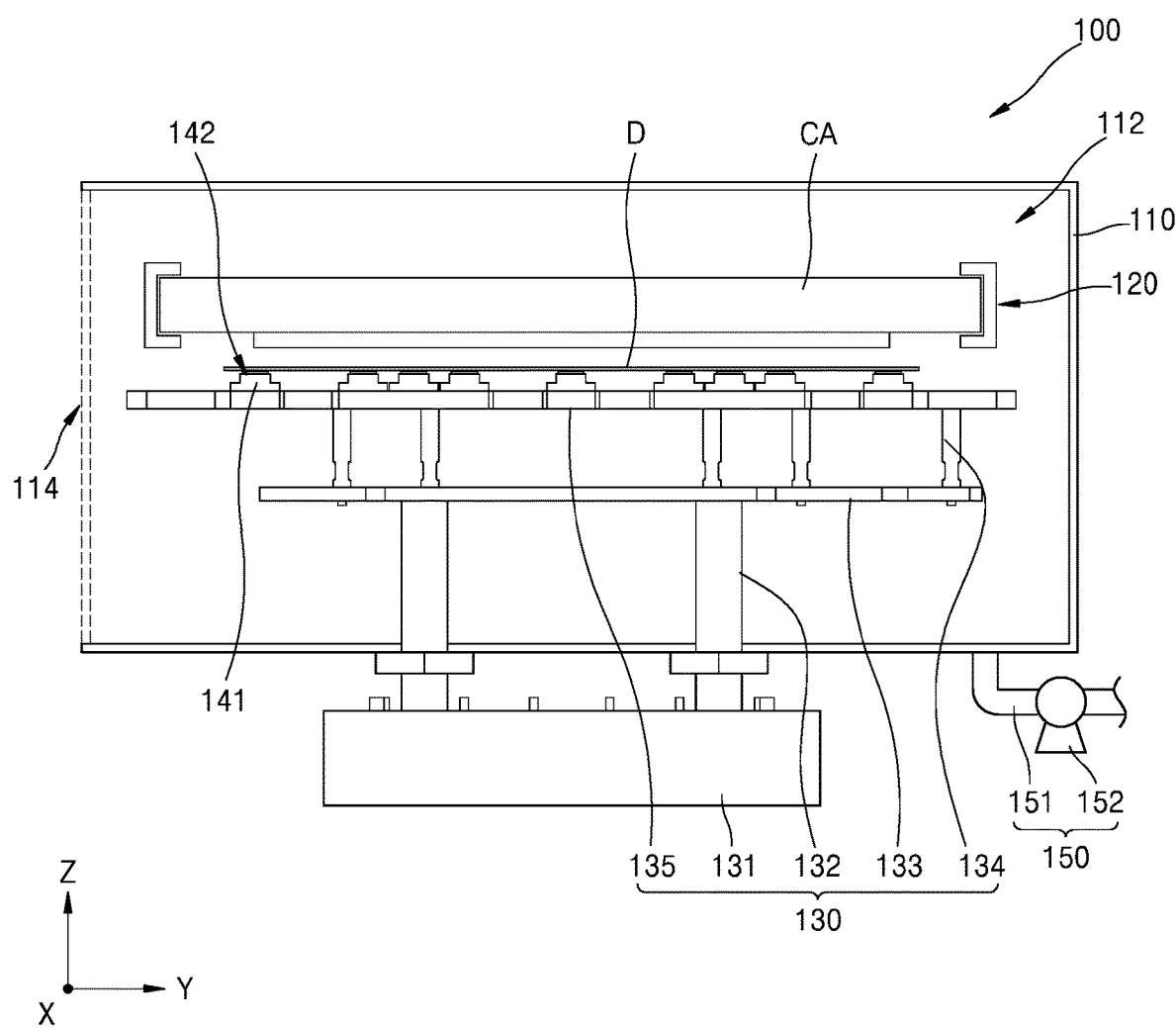
FIG. 2 is a cross-sectional view of an embodiment of the first processing unit of FIG. 1.

A display substrate D shown in FIG. 2 may be loaded in the first processing unit 100 from the outside, or the first processing unit 100 may turn the display substrate D loaded from the outside upside side down. According to another embodiment, the first processing unit 100 may perform an operation of attaching the display substrate D onto a carrier CA shown in FIG. 2. Hereinafter, for convenience of explanation, descriptions will be given in detail focusing is on a case in which the first processing unit 100 performs the operation of attaching the display substrate D onto the carrier CA.

The first processing unit 100 may be connected to various devices or to the outside. For example, the first processing unit 100 may be connected to other processing units, and the display substrate D, on which predetermined operations are completed, may be loaded in the first processing unit 100. According to another embodiment, the display substrate D may be loaded in the first processing unit 100 from the outside. Hereinafter, for convenience of explanation, descriptions will be given in detail focusing on a case in which the display substrate D is inserted into the first processing unit 100 from the outside.

The first processing unit 100 may be sequentially connected with the second processing unit 200 and the third processing unit 300. In this case, the second processing unit 200 and the third processing unit 300 may form various layers on the display substrate D. For example, one of the second processing unit 200 and the third processing unit 300 may form at least one of an intermediate layer, an opposite electrode, and a thin-film encapsulation layer. In this case, each of the second processing unit 200 and the third processing unit 300 may be provided in plural. The plurality of second processing units 200 may be connected to each other, and the plurality of third processing units 300 may be serially connected to ends of the plurality of second processing units 200. In this case, the second processing units 200 and the third processing units 300 may be formed to be the same or substantially the same as each other, and thus, hereinafter, for convenience of explanation, descriptions will be given in detail focusing on the second processing unit 200.

The fourth processing unit 400 may be connected to the third processing unit 300 and may temporarily accommodate the display substrate D, on which an operation of the third processing unit 300 is completed. The fourth processing unit 400 may be formed to be substantially the same as the first processing unit 100 and may separate the display substrate D from the carrier CA. In this case, the fourth processing unit 400 may be connected with the first processing unit 100, and the carrier CA may move back from the fourth processing unit 400 to the first processing unit 100 so as to operate repetitively with respect to the apparatus 1 for manufacturing a display apparatus. According to another embodiment, the fourth processing unit 400 may not separate the display substrate D from the carrier CA, and the carrier CA may be directly withdrawn from the fourth processing unit 400. In this case, the carrier CA may be provided in plural, and when one of the plurality of carriers CA is taken out from the fourth processing unit 400, another of the plurality of carriers CA may be introduced into the first processing unit 100. Hereinafter, for convenience of explanation, descriptions will be given in detail focusing on a case in which the carrier CA is taken out from the fourth processing unit 400.

Between each processing unit described above or at each of an entrance of the first processing unit 100 and an exit of the fourth processing unit 400, an opening and shutting unit 500 may be arranged. The opening and shutting unit 500 may include a gate valve. The opening and shutting unit 500 may selectively separate or connect to an inner space of each processing unit, such as a gate or door. Also, the opening and shutting unit 500 arranged at the entrance of the first processing unit 100 or the exit of the fourth processing unit 400 may selectively operate so as to connect or disconnect the first processing unit 100 or the fourth processing unit 400 to or from the outside.

The apparatus 1 for manufacturing a display apparatus described above may have the display substrate D introduced into the first processing unit 100. The display substrate D may be moved by a robot arm, etc. arranged outside or inside the first processing unit 100.

When the display substrate D is introduced into the first processing unit 100, the display substrate D may be attached by the carrier CA in the first processing unit 100. Thereafter, the carrier CA may move to the second processing unit 200 and the third processing unit 300 from the first processing unit 100 so as to form each layer on the display substrate D. For example, the second processing unit 200 may form, on the display substrate D, at least one layer included in an intermediate layer, and the third processing unit 300 may form, on the display substrate D, at least one from among at least one layer included in the intermediate layer, a protection layer, an opposite electrode, and a thin-film encapsulation layer. Here, according to the number of layers included in the intermediate layer or the number of organic emission layers, the second processing unit 200 may be arranged in plural so that the plurality of second processing units 200 may sequentially form the layers. According to another embodiment, the layers may be formed on the display substrate D by exchanging deposition materials used in the second processing unit 200. The third processing unit 300 may also be provided in plural of may form the layers on the display substrate D by exchanging deposition materials.

After various layers are formed on the display substrate D as described above, the display substrate D may be moved to the fourth processing unit 400, and then, the display substrate D may be taken out from the fourth processing unit 400.

The apparatus 1 for manufacturing a display apparatus is not limited to the operations described above. For example, the apparatus 1 for manufacturing a display apparatus may also include a processing unit configured to form a thin-film encapsulation layer, in addition to the layers described above. According to another embodiment, after the opposite electrode is formed, the apparatus 1 for manufacturing a display apparatus may further include a processing unit configured to remove a portion of the display substrate D to form a hole in the display substrate D. In this case, the processing unit configured to form the hole in the display substrate D may be arranged between the third processing unit 300 and the fourth processing unit 400. However, hereinafter, for convenience of explanation, a case in which the apparatus 1 for manufacturing a display apparatus forms the intermediate layer and the opposite electrode as described above will be mainly described in detail.

Hereinafter, the first processing unit 100 will be described in detail.

FIG. 2 is a cross-sectional view of an embodiment of the first processing unit 100 of FIG. 1.

Figure 7:
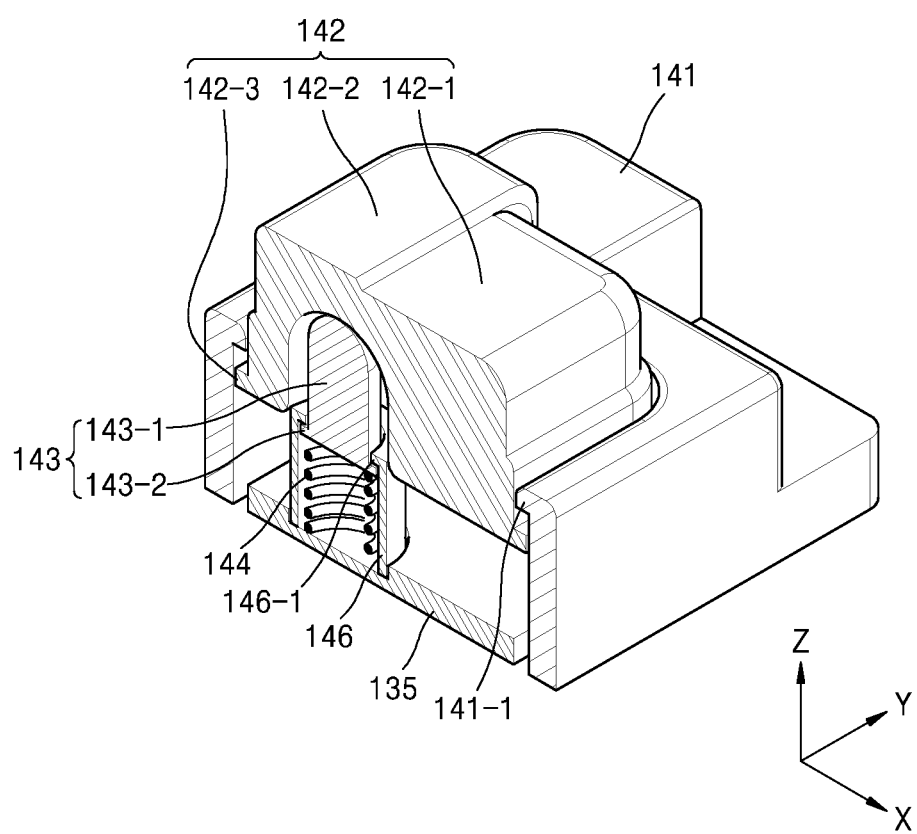
FIG. 7 is a cross-sectional perspective view of an embodiment of the mounting portion of FIG. 6.

Referring to FIG. 2, the first processing unit 100 may include a first processing chamber 110, a carrier driver, which may be in the form of a carrier driving portion 120, a support which may be in the form of a mounting portion 142, a substrate driver, which may be in the form of a driving portion 130, an elastic portion, which may be in the form of a spring 144 shown in FIG. 7, an accommodating portion, which may be in the form of a housing 141, a guide portion, which may be in the form of a guide 146 shown in FIG. 7, a balance adjusting portion, which may be in the form of a plunger 143 shown in FIG. 7), and a first processing pressure adjusting portion, which may be in the form of a valve 150.

The first processing chamber 110 may have an inner space 112 and may be formed to be connected to another processing unit or the outside. In this case, an opening portion 114 may be provided in the first processing chamber 110 to provide access to the inner space, and the opening and shutting unit 500 as illustrated in FIG. 1 may be arranged in the opening portion 114 to selectively open and shut the opening portion 114.

The carrier driving portion 120 may interactively operate with the carrier CA to linearly move the carrier CA in one or more of the x, y and z directions, such as the z direction in FIG. 2. The carrier driving portion 120 may be arranged in each of the first through fourth processing units 100, 200, 300 and 400 illustrated in FIG. 1. In this case, the carrier driving portion 120 may be provided only inside each processing unit and may not be arranged in a portion in which the opening and shutting unit 500 is arranged.

The carrier driving portion 120 may include various forms of structure as long as it is capable of supporting the carrier for linear movement in the directions noted above. For example, the carrier driving portion 120 may include a magnetic levitation rail. According to another embodiment, the carrier driving portion 120 may include a chain, and the carrier CA may include a sprocket connected to the chain. Thus, the carrier driving portion 120 is not limited thereto and may include all devices and structures for linearly moving the carrier CA. However, hereinafter, for convenience of explanation, a case in which the carrier driving portion 120 includes a magnetic levitation rail will be mainly described in detail.

The carrier CA may be supported for linear movement along with the carrier driving portion 120. The carrier CA may include an electrostatic chuck or an adhesive chuck for attaching the display substrate D. The carrier CA may also include a charge module (e.g. wireless charge module) and a power supply line for supplying power to the charge module of the carrier CA. The power supply line may be arranged in the same direction as the carrier driving portion 120 and between the carrier driving portions 120. The carrier CA may further include a battery connected to the wireless charge module, in addition to the components described above. However, hereinafter, for convenience of explanation, a case in which the carrier CA includes an electrostatic chuck will be mainly described in detail.

The mounting portion 142 may be mounted on the driving portion 130 and is provided in plural. Each mounting portion 142 may be support for linear movement according to the movement of the driving portion 130. For example, as shown in FIG. 7, the mounting portion 142 may be inserted into an housing 141 and the driving portion 130 may move it linearly (for example, an upward or downward movement in the Z-axis direction) along with the guide 146.

The driving portion 130 may be arranged inside or outside the first processing chamber 110 and may linearly move the display substrate D in the z axis direction to contact the Carrier CA. In detail, the driving portion 130 may include a driving force generating portion 131, connection portions 132 and 134, and supporting portions 133 and 135. The connection portions 132 and 134 may include a first connection portion 132 connected to a driving force generating portion 131 and a second connection portion 134 connected to the supporting portions 133 and 135. Also, the supporting portions 133 and 135 may include: a first supporting portion 133 arranged between the first connection portion 132 and the second connection portion 134 and connecting the first connection portion 132 and the second connection portion 134 with each other; and a second supporting portion 135 arranged between the mounting portion 142 and the second connection portion 134.

The spring 144 of FIG. 7 may be arranged inside the guide and may apply an elastic force to the mounting portion 142 as shown in FIG. 7. The spring may be into the form of any member such as a coil spring 9 as shown in the Figures), an elastic material, or other structure capable of providing an elastic restoring force.

The housing 141 may receive and support the mounting portion 142 for reciprocal linear movement therein, e.g., in the z-axis direction. The housing 141 may not only guide the movement path of the mounting portion 142, but also may limit the movement range of the mounting portion 142.

Figure 8:
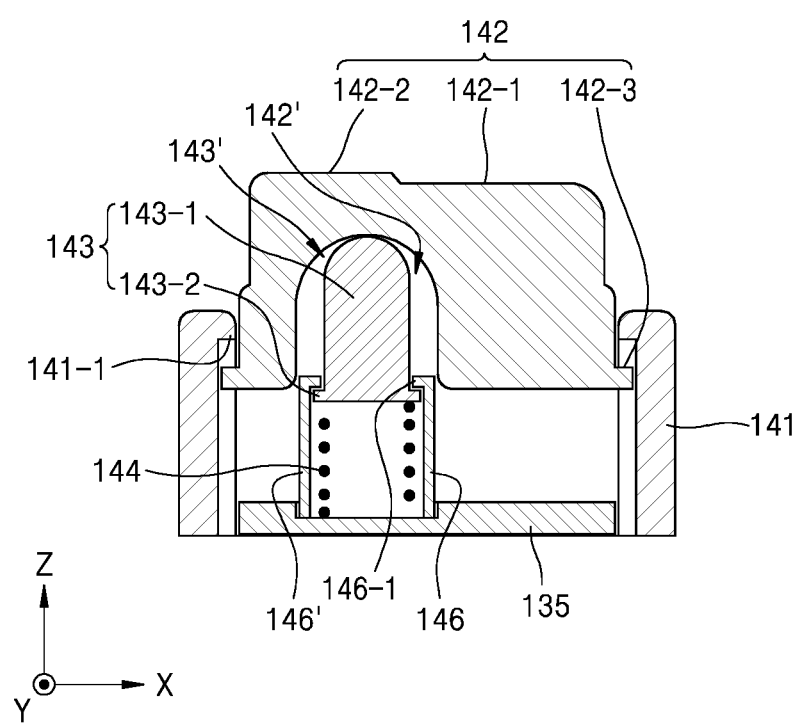
FIG. 8 is a cross-sectional view of the mounting portion of FIG. 7.

For example, referring to FIG. 8, the guide 146 may be arranged in the housing 141 and may receive therein the spring 144. The guide 146 may prevent the spring 144 from being bent.

The plunger 143 may be inserted into the guide 146 to guide the movement of the plunger 143. The plunger 143 may support the spring 144 or may be arranged between the spring 144 and the mounting portion 142.

As shown in FIG. 2, the first processing pressure adjusting portion 150 may be connected to the first processing chamber 110 and may adjust the pressure in the first processing chamber 110. The first processing pressure adjusting portion 150 may include a first processing pressure adjusting pipe 151 and a valve connected to the first processing chamber 110 and a first processing pressure adjusting pump 152 arranged in the first processing pressure adjusting pipe 151. The first processing pressure adjusting portion 150 may adjust the internal pressure of the first processing chamber 110 by discharging gas in the first processing chamber 110 to the outside or supplying gas outside the first processing chamber 110 into the first processing chamber 110.

The display substrate D may be attached to the carrier CA in the first processing chamber 110 in the following manner.

First, the first processing pressure adjusting portion 150 may operate to adjust the pressure in the first processing chamber 110 to be the same or substantially the same as the air pressure or internal pressure of another chamber connected to the first processing unit 100. Thereafter, the opening and shutting unit 500 of FIG. 1 arranged in the opening portion 114 of the first processing chamber 110 may be opened, so that, for example, the display substrate D may be loaded from the another chamber and also arranged on the plurality of mounting portions 142 in the first processing chamber 110.

Thereafter, the opening portion of the first processing chamber 110 may be isolated by the opening and shutting unit 500 of FIG. 1, such that the first processing pressure adjusting portion 150 may operate to adjust the internal pressure of the first processing chamber 110 to be the same or substantially the same as a vacuum state by discharging the gas in the first processing chamber 110 to the outside.

Thereafter, the driving force generating portion 131 may operate to linearly move the first connection portion 132 in a Z-axis direction of FIG. 2, and according to the movement of the first connection portion 132, the first supporting portion 133, the second connection portion 134, and the second supporting portion 135 may also make an ascending movement along with the first connection portion 132. In this case, the plurality of mounting portions 142 arranged on the second supporting portion 135 may ascend so as to locate the display substrate D near the carrier CA, and when the display substrate D is moved a predetermined distance from the carrier CA, the display substrate D may be attached to the carrier CA.

When the process described above is completed, the first processing pressure adjusting portion 150 may operate to adjust the pressure in the first processing chamber 110 to be the same or substantially the same as the pressure in a second processing chamber of the second processing unit 200. Thereafter, the opening and shutting unit 500 between the first processing unit 100 and the second processing unit 200 may be opened, and the carrier CA may move from the first processing unit 100 to the second processing unit 200.

Figure 3:
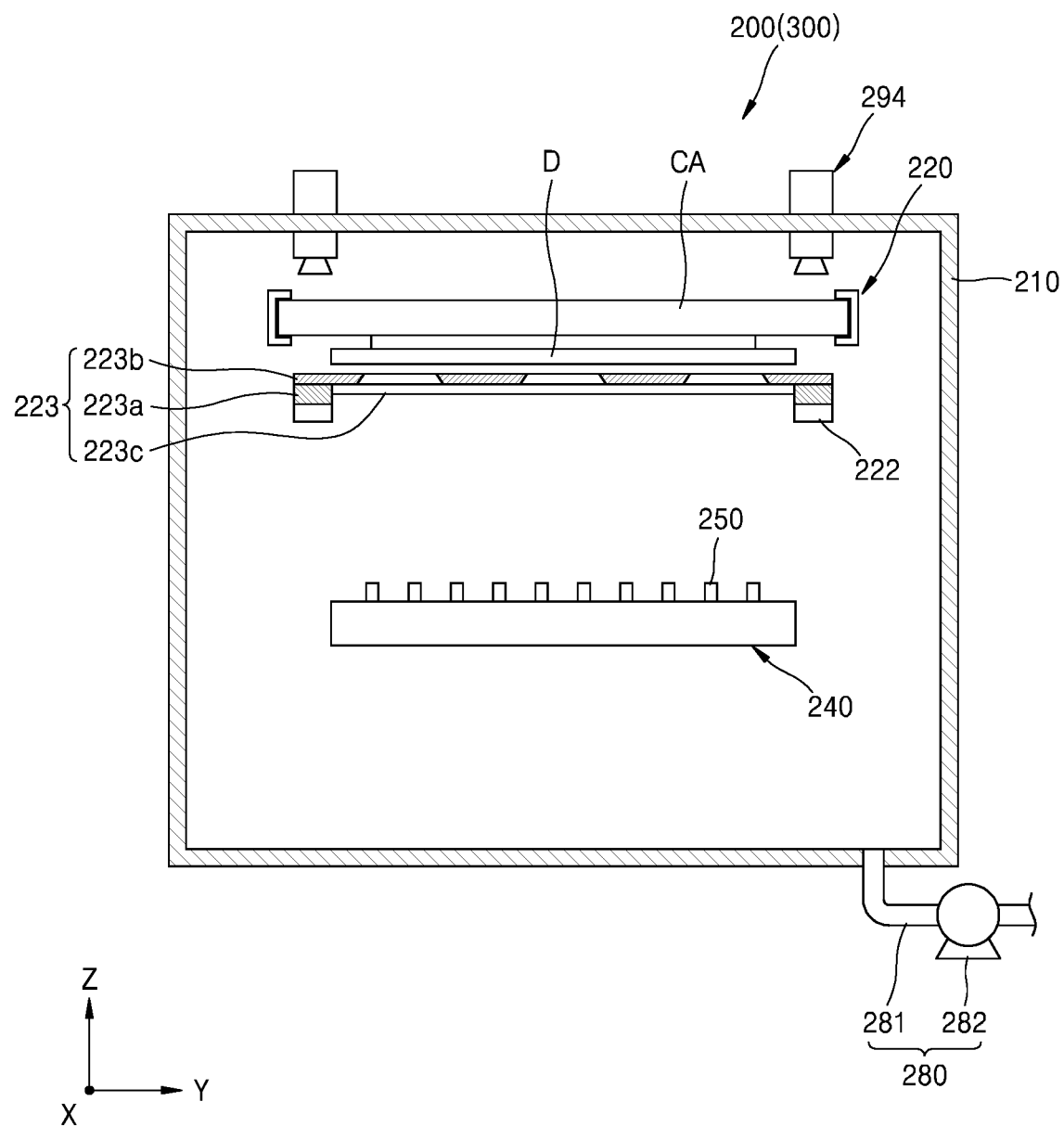
FIG. 3 is a cross-sectional view of an embodiment of the second processing unit of FIG. 1.

FIG. 3 is a cross-sectional view of an embodiment of the second processing unit 200 of FIG. 1.

Referring to FIG. 3, the second processing unit 200 may include a second processing chamber 210, a carrier supporting portion 220, a second supporting portion 222, a mask assembly 223, a deposition source 240, a nozzle portion 250, a second processing pressure adjusting portion 280, and a vision portion 294.

An inner space may be formed in the second processing chamber 210. The second processing chamber 210 may be formed to have an open portion, and an opening and shutting unit (e.g., gate valve, etc.) may be formed in the open portion of the second processing chamber 210 to open or close the open portion of the second processing chamber 210.

The carrier supporting portion 220 may be arranged in the second processing chamber 210 and may support the carrier CA. The carrier supporting portion 220 may support the carrier CA such that the carrier CA may perform a linear movement. In detail, the carrier supporting portion 220 may have the same shape as the carrier driving portion 120 described with respect to FIG. 2 above.

The mask supporting portion 222 may support the mask assembly 223. The mask supporting portion 222 may be formed as a clamp and may fix the mask assembly 223 by clasping the mask assembly 223. According to another embodiment, the mask supporting portion 222 may be formed as a plate, and the mask assembly 223 may be arranged on the mask supporting portion 222. According to another embodiment, the mask supporting portion 222 may be formed as a stage on which the mask assembly 223 is mounted. In this case, the mask supporting portion 222 may allow the mask assembly 223 to upward or downward within a predetermined distance range and rotate within a predetermined angle range. In addition, the mask supporting portion 222 may also linearly move the mask assembly 223 in various directions within a predetermined distance range.

The mask assembly 223 may include a mask frame 223a and a mask 223b. The mask frame 223a may be formed as a grid and an opening area may be formed in the middle of the mask frame 223a. In this case, the opening area may correspond to a single opening area or may be divided into a plurality of opening areas. Here, when the opening area is divided into the plurality of opening areas, one or more supporting frames 223c may be arranged in the opening area to divide the opening area into the plurality of opening areas. The supporting frame 223c may be arranged in a length direction or a width direction of the mask frame 223a. The mask 223 may be arranged above the mask frame 223a. The mask 223b may be arranged on the mask frame 223a as a singular mask or a plurality of masks. When a plurality of masks 223b are arranged on the mask frame 223a, the plurality of masks 223b may be arranged in one direction to shield the opening area of the mask frame 223a. Hereinafter, for convenience of explanation, a case in which the mask 223b is provided as a singular mask and arranged on the mask frame 223a, and the opening area of the mask frame 223a is shielded will be mainly described in detail. The mask 223b above may include one or more openings. Here, when the plurality of openings are arranged, the plurality of openings may be arranged in an area of the mask 223b to form a pattern. Also, when the plurality of openings are arranged, the openings may be arranged in a plurality of areas of the mask 223b to be separate from each other, and the opening may be arranged in each of the plurality of areas to form a pattern.

The deposition source 240 may be arranged in the second processing chamber 210. The deposition source 240 may accommodate a deposition material. The deposition source 240 may include a heater configured to heat the deposition material.

The nozzle portion 250 may be connected to the deposition source 240 and may guide the deposition material vaporized or sublimed by the deposition source 240 to the outside. The nozzle portion 250 may include one or more nozzles. The nozzles may be spaced apart from each other and may correspond to point nozzles, whereby the nozzles are arranged to have the shape of points. According to another embodiment, the nozzles may have the shape of a line injecting a deposition material onto a predetermined area.

The second processing pressure adjusting portion 280 may be connected to the second processing chamber 210 and may adjust the pressure in the second processing chamber 210. The second processing pressure adjusting portion 280 may include a second processing pressure adjusting pipe 281 connected to the second processing chamber 210 and a second processing pressure adjusting pump 282 arranged in the second processing pressure adjusting pipe 281. In this case, the second processing pressure adjusting pipe 281 may be connected to an additional device capable of removing external contaminants.

The vision portion 294 may be arranged in the second process chamber 210 and may capture locations of the display substrate D and the mask assembly 223. The display substrate D may be aligned with the mask assembly 223 based on the locations of the display substrate D and the mask assembly 223, captured by the vision portion 294.

With respect to a method of manufacturing a display apparatus through the second process portion 200, the display substrate D and the mask assembly 223 may be inserted into the second processing chamber 210. The second processing pressure adjusting portion 280 may maintain the pressure in the second processing chamber 210 at the same or substantially the same as the air pressure. According to another embodiment, the second processing pressure adjusting portion 280 may adjust the internal pressure of the second processing chamber 210 such that the internal pressure of the first processing chamber 110 and the internal pressure of the second processing chamber 210 are the same or substantially the same as each other.

Thereafter, the vision portion 294 may capture an align mark of the display substrate D and an align mark of the mask assembly 223, and the display substrate D may be aligned with the mask assembly 223 based on the captured align marks. In particular, the location of the mask assembly 223 may be finely adjusted through the mask supporting portion 222.

After the process described above is completed, the deposition source 240 may supply the deposition material and deposit the deposition material on the display substrate D.

Figure 4A:
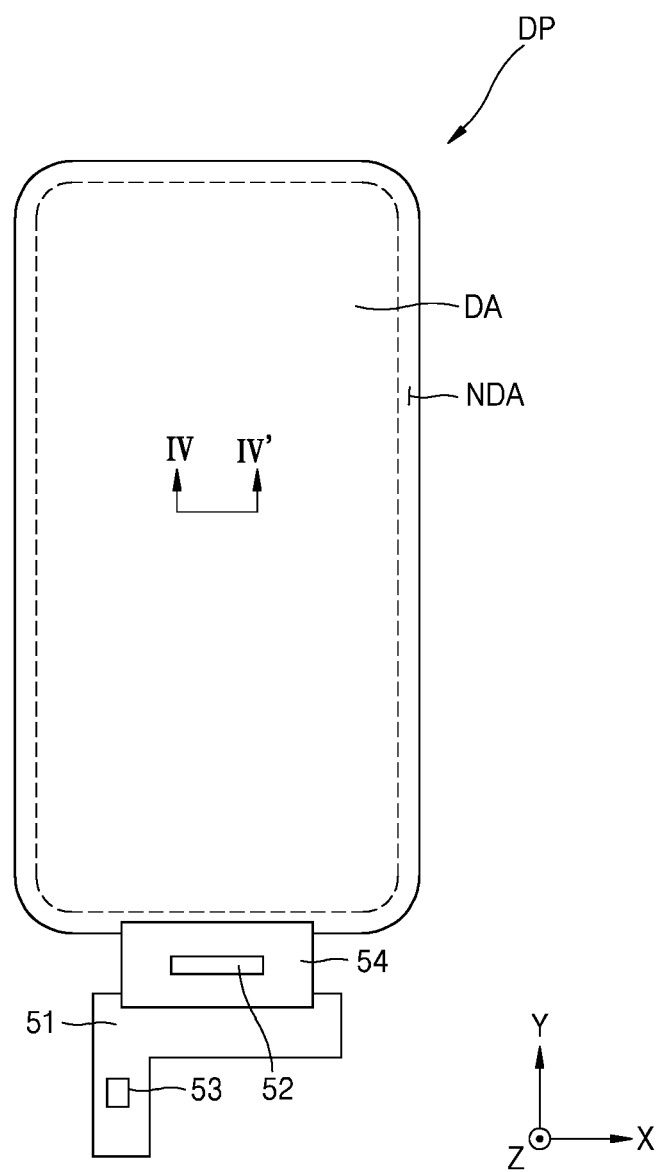
FIG. 4A is a plan view of an embodiment of a display apparatus manufactured by the apparatus of FIG. 1.
Figure 4B:
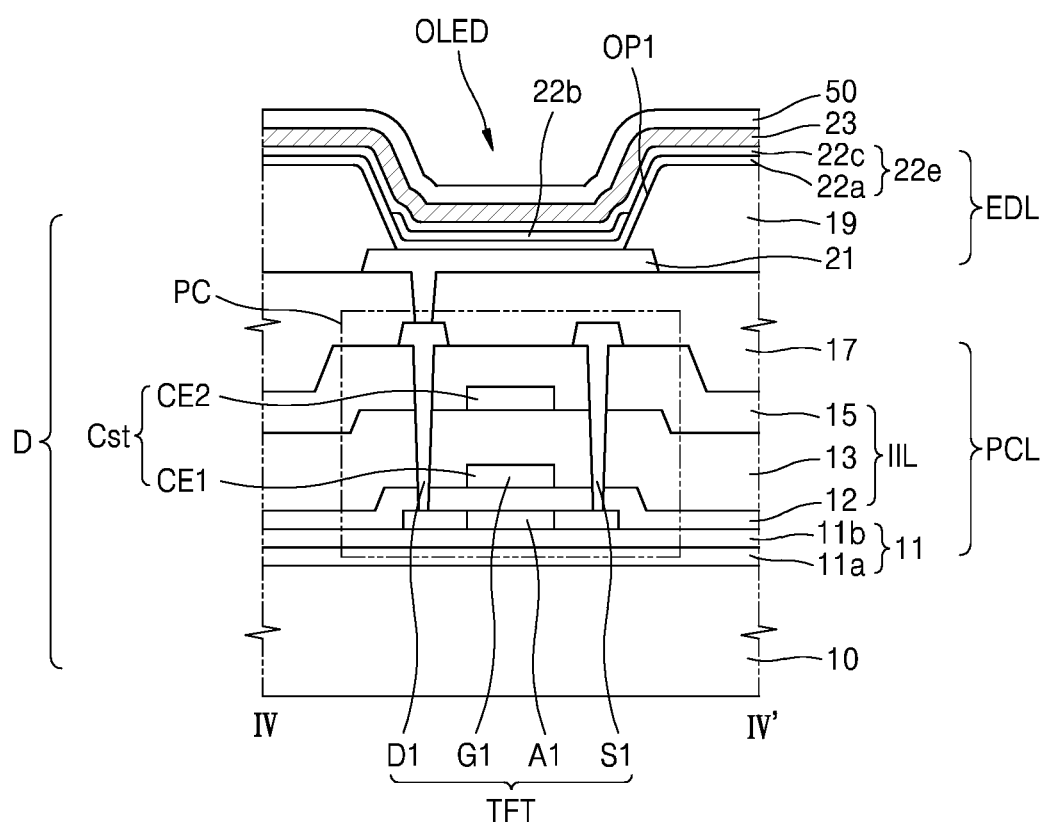
FIG. 4B is a cross-sectional view taken along line IV-IV' of FIG. 4A.

FIG. 4A is a plan view of an embodiment of a display apparatus DP manufactured by the apparatus 1 of FIG. 1 FIG. 4B is a cross-sectional view taken along line IV-IV' of FIG. 4A.

Referring to FIGS. 4A and 4B, the display apparatus DP may include a display area DA and a non-display area NDA. Here, sub-pixels may be arranged in the display area DA to realize an image, and lines, etc. may be arranged in the non-display area NDA. The display apparatus DP may include a substrate 10, a buffer layer 11, a circuit layer PCL, and a display element layer EDL that are stacked. The display apparatus DP may include the display substrate D. The display substrate D may include at least one of the substrate 10, the buffer layer 11, the circuit layer PCL, and the display element layer EDL. Hereinafter, for convenience of explanation, a case in which the display substrate D includes a pixel electrode 21 and a pixel-defining layer 19 from among the substrate 10, the buffer layer 11, the circuit layer PCL, and the display element layer EDL will be mainly described in detail.

As described above, the substrate 10 may include an insulating material, such as glass, quartz, and polymer resins. The substrate 10 may include a rigid substrate or a flexible substrate, which may be bent, folded, or rolled.

The buffer layer 11 may be located on the substrate 10, may reduce or prevent penetration of foreign materials, moisture, or external air from below the substrate 10, and may planarize the substrate 10. The buffer layer 11 may include an inorganic material, such as oxide or nitride, an organic material, or an organic and inorganic compound, and may have a single-layered structure or a multi-layered structure including an inorganic material and/or an organic material. A barrier layer preventing the penetration of foreign substances may further be between the substrate 10 and the buffer layer 11. In some embodiments, the buffer layer 11 may include silicon oxide ($SiO_2$) or silicon nitride ($SiN_x$). The buffer layer 11 may include a first buffer layer 11a and a second buffer layer 11b that are stacked.

The circuit layer PCL may be arranged above the buffer layer 11 and may include a pixel circuit PC, a first gate insulating layer 12, a second gate insulating layer 13, an interlayer insulating layer 15, and a planarization layer 17. The pixel circuit PC may include a thin-film transistor TFT and a storage capacitor Cst.

The main thin-film transistor TFT may be arranged above the buffer layer 11. The thin film transistor TFT may include a first semiconductor layer A1, a first gate electrode G1, a first source electrode S1, and a first drain electrode D1. The main thin-film transistor TFT may be connected to an organic light-emitting diode OLED and may be configured to drive the organic light-emitting diode OLED.

The first semiconductor layer A1 may be arranged on the buffer layer 11 and may include polysilicon. According to another embodiment, the first semiconductor layer A1 may include amorphous silicon. According to another embodiment, the first semiconductor layer A1 may include oxide of at least one material selected from the group consisting of In, Ga, Sn, Zr, V, Hf, Cd, Ge, Cr, Ti, and Zn. The first semiconductor layer A1 may include a channel area, and a source area and a drain area doped with impurities.

The first gate insulating layer 12 may be provided to cover the first semiconductor is layer A1. The first gate insulating layer 12 may include an inorganic insulating material, such as $SiO_2$, $SiN_x$, silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 12 may include a single layer or multiple layers including the organic insulating materials described above.

The first gate electrode G1 may be arranged above the first gate insulating layer 12 to overlap the first semiconductor layer A1. The first gate electrode G1 may include Mo, Al, Cu, Ti, etc., and may include a single layer or layers. For example, the first gate electrode G1 may in dude a single Mo layer.

The second gate insulating layer 13 may be included to cover the first gate electrode G1. The second gate insulating layer 13 may include an inorganic insulating material, such as $SiO_2$, $SiN_x$, SiON, $Al_2O_3$, $TiO_2$, $Ta_2O_5$, $HfO_2$, or $ZnO_2$. The second gate insulating layer 13 may include a single layer or multiple layers including the organic insulating materials described above.

A first upper electrode CE2 of the main storage capacitor Cst may be arranged above the second gate insulating layer 13.

The first upper electrode CE2 may overlap the first gate electrode G1 therebelow in the display area DA. The first gate electrode G1 and the first upper electrode CE2 overlapping each other with the second gate insulating layer 13 therebetween may be included in the main storage capacitor Cst. The first gate electrode G1 may correspond to a first lower electrode CE1 of the main storage capacitor Cst.

The first upper electrode CE2 may include Al, Pt, Pd, Ag, Mg, Au, Ni, Nd, Ir, Cr, Ca, Mo, Ti, W, and/or Cu and may include a single layer or multiple layers including the materials described above.

The interlayer insulating layer 15 may be formed to cover the first upper electrode CE2. The interlayer insulating layer 15 may include $SiO_2$, $SiN_x$, SiON, $Al_2O_3$, $TiO_2$, $Ta_2O_5$, $HfO_2$, or $ZnO_2$. The interlayer insulating layer 15 may include a single layer or multiple layers including the inorganic insulating materials described above.

The first source electrode S1 and the first drain electrode D1 may be arranged on the interlayer insulating layer 15. The first source electrode S1 and the first drain electrode D1 may include a conductive material including Mo, Al, Cu, Ti, etc., and may include multiple layers or a single layer including the materials described above. For example, the first source electrode Si and the first drain electrode D1 may include a multi-layered structure including Ti/Al/Ti.

The planarization layer 17 may be arranged to cover the first source electrode S1 and the first drain electrode D1. The planarization layer 17 may have a planarized upper surface to planarize the pixel electrode 21 arranged above the planarization layer 17.

The planarization layer 17 may include an organic material or an inorganic material and may have a single-layered structure or a multi-layered structure. The planarization layer 17 may include benzocyclobutene (BCB), PI, hexamethyldisiloxane (HMDSO), polymethylmethacrylate (PMMA), or a general-purpose polymer, such as polystyrene (PS), a polymer derivate having a phenol-based group, an acryl-based polymer, an imide-based polymer, an aryl ether-based polymer, an amide-based polymer, a fluorine-based polymer, a p-xylene-based polymer, or a vinyl alcohol-based polymer. The planarization layer 17 may include an inorganic insulating material, such as $SiO_2$, $SiN_x$, SiON, $Al_2O_3$, $TiO_2$, $Ta_2O_5$, $HfO_2$, or $ZnO_2$. When forming the planarization layer 17, chemical mechanical polishing may be performed on an upper surface of a layer that is formed, in order to provide a flat upper surface.

The planarization layer 17 may have a via-hole exposing any one of the first source electrode S1 and the first drain electrode D1 of the main thin-film transistor TFT, and the pixel electrode 21 may contact the first source electrode S1 or the first drain electrode D1 through the via-hole to be electrically connected to the main thin-film transistor TFT.

The pixel electrode 21 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 21 may include a reflective layer including Ag, Mg, Al, Pt, Pd, Au, Ni, Nd, Ir, Cr, or a compound thereof. For example, the pixel electrode 21 may have a structure in which the pixel electrode 21 includes layers including ITO, IZO, ZnO or $In_2O_3$ above/below the reflective layer described above. In this case, the pixel electrode 21 may have a structure in which ITO/Ag/ITO layers are stacked.

The pixel-defining layer 19 may cover an edge of the pixel electrode 21 on the planarization layer and may include a first opening OP1 exposing a central portion of the pixel electrode 21. A size and a shape of an emission area of the organic light-emitting diode OLED, that is, a sub-pixel Pm, may be defined by the first opening OP1.

The pixel-defining layer 19 may increase a distance between the edge of the pixel electrode 21 and an opposite electrode 23 above the pixel electrode 21 so as to prevent arcs, etc. from occurring at the edge of the pixel electrode 21. The pixel-defining layer 19 may be formed by using a spin coating method, etc., by using an organic insulating material, such as PI, polyamide, acryl resins, BCB, HMDSO, phenol resins, etc.

An emission layer 22b formed to correspond to the pixel electrode 21 may be arranged in the first opening OP1 of the pixel-defining layer 19. The emission layer 22b may include a high-molecular weight material or a low-molecular weight material and may emit red, green, blue, or white light.

An organic functional layer 22e may be arranged above and/or below the emission layer 22b. The organic functional layer 22e may include a first functional layer 22a and/or a second functional layer 22c. The first functional layer 22a or the second functional layer 22c may be omitted.

The first functional layer 22a may be arranged below the emission layer 22b. The first functional layer 222a may include a single layer or multiple layers including an organic material. The first functional layer 22a may include a hole transport layer (HTL) having a single-layered structure. Alternatively, the first functional layer 22a may include a hole injection layer (HIL) and an HTL. The first functional layer 22a may integrally correspond to the organic light-emitting diodes OLED included in the display area DA and the component area CA.

The second functional layer 22c may be arranged above the emission layer 22b. The second functional layer 22c may include a single layer or multiple layers including an organic material. The second functional layer 22c may include an electron transport layer (ETL) and/or an electron injection layer (EIL). The second functional layer 22c may be integrally formed to correspond to the organic light-emitting diodes OLEDs included in the display area DA.

The opposite electrode 23 may be arranged above the second functional layer 122c. The opposite electrode 23 may include a conductive material having a low work function. For example, the opposite electrode 23 may include a (semi) transparent layer including Ag, Mg, Al, Pt, Pd, Au, Ni, Nd, Ir, Cr, Li, Ca, or an alloy thereof. Alternatively, the opposite electrode 23 may further include a layer, such as ITO, IZO, ZnO, or $In_2O_3$, on the (semi) transparent layer including the materials described above. The opposite electrode 23 may be integrally formed to correspond to the organic light-emitting diodes OLEDs included in the display area DA.

Layers formed between the pixel electrode 21 and the opposite electrode 123 in the display area DA may be included in the organic light-emitting diode OLED.

An upper layer 50 including an organic material may be formed above the opposite electrode 23. The upper layer 50 may be provided to protect the opposite electrode 23 and increase the light extraction efficiency. The upper layer 50 may include an organic material having a higher refractive index than an organic material of the opposite electrode 23. Alternatively, the upper layer 50 may include stacked layers having different refractive indices. For example, the upper layer 50 may be formed by including a high refractive index layer, a low refractive index layer, and a high refractive index layer that are stacked. Here, a refractive index of the high refractive index layer may be about equal to or higher than 1.7 and a refractive index of the low refractive index layer may be about equal to or lower than 1.3.

The upper layer 50 may additionally include LiF. Alternatively, the upper layer 50 may additionally include an inorganic insulating material, such as $SiO_2$, $SiN_x$, etc. The upper layer 50 may be omitted according to necessity. However, hereinafter, a case in which the upper layer 50 is arranged on the opposite electrode 23 will be mainly described in detail, for convenience of explanation.

The display apparatus DP as described above may include an encapsulation member shielding the upper layer 50. According to an embodiment, the encapsulation member may include an encapsulation substrate arranged to face the substrate 10 and a sealing member arranged between the substrate 10 and the encapsulation substrate to shield a space between the substrate 10 and the encapsulation substrate from the outside.

According to another embodiment, the encapsulation member may include a thin-film encapsulation layer. The thin-film encapsulation layer may be arranged on the upper layer 50 to directly contact the upper layer 50. The thin-film encapsulation layer may cover the display area DA and a portion of the non-display area to prevent penetration of external moisture and oxygen. The thin-film encapsulating layer may include at least one organic encapsulating layer and at least one inorganic encapsulating layer. Hereinafter, for convenience of explanation, a case in which the thin-film encapsulation layer includes a first inorganic encapsulation layer, an organic encapsulation layer, and a second inorganic encapsulation layer sequentially stacked on an upper surface of the upper layer 50 will be mainly described in detail.

In this case, the first inorganic encapsulation layer may cover the opposite electrode 23 and may include SiOx, SiNx, and/or SiON. The first inorganic encapsulation layer may be formed along a structure therebelow, and thus, an upper surface of the first inorganic encapsulation layer may not be flat. The organic encapsulation layer may cover the first inorganic encapsulation layer. However, unlike the first inorganic encapsulation layer, an upper surface of the organic encapsulation layer may be substantially flat. In detail, an upper surface of the organic encapsulation layer, the upper surface being in a location corresponding to the display area DA, may be substantially flat. The organic encapsulation layer may include at least one material selected from the group consisting of polyethylene terephthalate, polyethylene naphthalate, polycarbonate, polyimide, polyethylene sulfonate, polyoxymethylene, polyarylate, and HMDSO. The second inorganic encapsulation layer may cover the organic encapsulation layer and may include silicon oxide, silicon nitride, and/or silicon oxynitride.

A touch screen layer may be arranged on the encapsulation member described above.

Figure 5A:
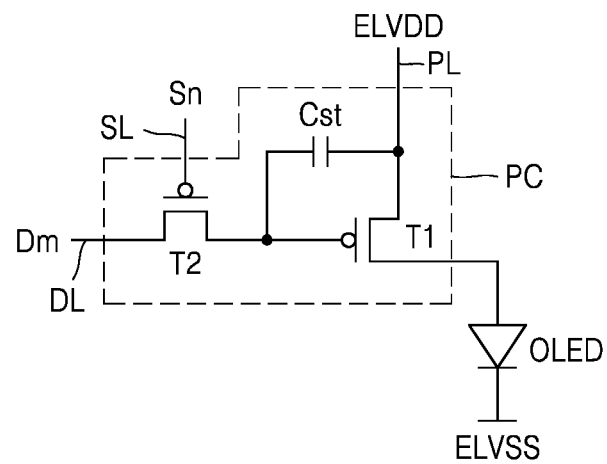
FIGS. 5A and 5B are equivalent circuit diagrams of embodiments of a representative pixel of the display apparatus of FIG. 4A.
Figure 5B:
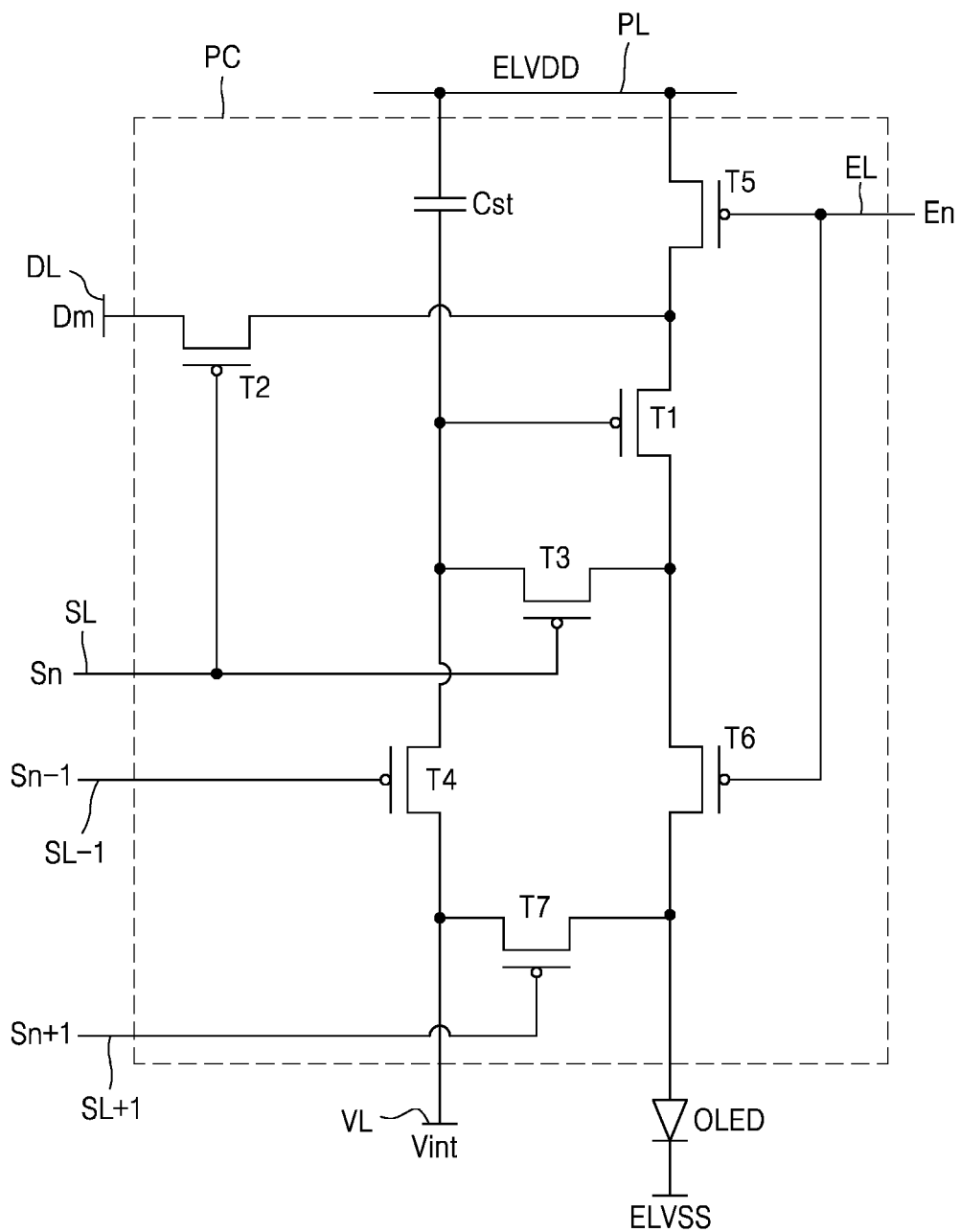

FIGS. 5A and 5B are equivalent circuit diagrams of embodiments of a representative pixel circuit PC driving a sub-pixel of the display apparatus of FIG. 4A.

Referring to FIGS. 5A and 5B, the pixel circuit PC may be connected to an organic light-emitting diode OLED to realize emission of the sub-pixels. The pixel circuit PC may include a driving thin-film transistor T1, a switching thin-film transistor T2, and a storage capacitor Cst. The switching thin-film transistor T2 may be connected to the scan line SL and the data line DL and may be configured to transmit a data signal Dm provided through the data line DL, to the driving thin-film transistor T1, in response to a scan signal Sn provided through the scan line SL.

The storage capacitor Cst may be connected to the switching thin-film transistor T2 and the driving voltage line PL and may store a voltage corresponding to a difference between a voltage received from the switching thin-film transistor T2 and the driving voltage ELVDD supplied to the driving voltage line PL.

The driving thin-film transistor T1 may be connected to the driving voltage line PL and the storage capacitor Cst. Also, the driving thin-film transistor T1 may be configured to control a driving current flowing from the driving voltage line PL through the organic light-emitting diode OLED in correspondence with a value of the voltage stored in the storage capacitor Cst. The organic light-emitting diode OLED may emit light having a certain brightness, according to the driving current.

It is described with respect to FIG. 5A that the pixel circuit PC includes two thin-film transistors and one storage capacitor. However, embodiments are not limited thereto.

Referring to FIG. 5B, the pixel circuit PC may include the driving thin-film transistor T1, the switching thin-film transistor T2, a compensation thin-film transistor T3, a first initialization thin-film transistor T4, an operation control thin-film transistor T5, an emission control thin-film transistor T6, and a second initialization thin-film transistor T7.

FIG. 5B illustrates a case where each pixel circuit PC includes signal lines SL, SL−1, SL+1, EL, and DL, an initialization voltage line VL, and the driving voltage line PL. However, embodiments are not limited thereto. According to another embodiment, at least one of the signal lines SL, SL−1, SL+1, EL, and DL and/or the initialization voltage line VL may be shared by neighboring pixel circuits.

A drain electrode of the driving thin-film transistor Ti may be electrically connected to the organic light-emitting diode OLED through the emission control thin-film transistor T6. The driving thin-film transistor T1 may be configured to receive a data signal Dm according to a switching operation of the switching thin-film transistor T2 and supply a driving current to the organic light-emitting diode OLED.

A gate electrode of the switching thin-film transistor T2 may be connected to the scan line SL, and a source electrode of the switching thin-film transistor T2 may be connected to the data line DL. A drain electrode of the switching thin-film transistor T2 may be connected to a source electrode of the driving thin-film transistor T1 and may be connected to the driving voltage line PL through the operation control thin-film transistor T5.

The switching thin-film transistor T2 may be turned on in response to a scan signal Sn transmitted through the scan line SL and may perform a switching operation of transmitting a data signal Dm transmitted through the data line DL to the source electrode of the driving thin-film transistor T1.

A gate electrode of the compensation thin-film transistor T3 may be connected to the scan line SL. A source electrode of the compensation thin-film transistor T3 may be connected to the drain electrode of the driving thin-film transistor T1 and may be connected to a pixel electrode of the organic light-emitting diode OLED through the emission control thin-film transistor T6. A drain electrode of the compensation thin-film transistor T3 may be connected to any one electrode of the storage capacitor Cst, a source electrode of the first initialization thin-film transistor T4, and a gate electrode of the driving thin-film transistor T1. The compensation thin-film transistor T3 may be turned on in response to a scan signal Sn transmitted through the scan line SL to connect the gate electrode of the driving thin-film transistor T1 with the drain electrode of the driving thin-film transistor T1, thereby diode-connecting the driving thin-film transistor T1.

A gate electrode of the first initialization thin-film transistor T4 may be connected to a previous scan line SL−1. A drain electrode of the first initialization thin-film transistor T4 may be connected to the initialization voltage line VL. A source electrode of the first initialization thin-film transistor T4 may be connected to any one electrode of the storage capacitor Cst, the drain electrode of the compensation thin-film transistor T3, and the gate electrode of the driving thin-film transistor T1. The first initialization thin-film transistor T4 may be turned on in response to a previous scan signal Sn−1 received through the previous scan line SL−1 and may perform an initialization operation of initializing a voltage of the gate electrode of the driving thin-film transists or T1 by transmitting an initialization voltage Vint to the gate electrode of the driving thin-film transistor T1.

A gate electrode of the operation control thin-film transistor T5 may be connected to an emission control line EL. A source electrode of the operation control thin-film transistor T5 may be connected to the driving voltage line PL. A drain electrode of the operation control thin-film transistor T5 may be connected to the source electrode of the driving thin-film transistor T1 and the drain electrode of the switching thin-film transistor T2.

A gate electrode of the emission control thin-film transistor T6 may be connected to the emission control line EL. A source electrode of the emission control thin-film transistor T6 may be connected to the drain electrode of the driving thin-film transistor T1 and the source electrode of the compensation thin-film transistor T3. A drain electrode of the emission control thin-film transistor T6 may be electrically connected to the pixel electrode of the organic light-emitting diode OLED. The operation control thin-film transistor T5 and the emission control thin-film transistor T6 may be simultaneously turned on in response to an emission control signal En received through the emission control line EL so that the driving voltage ELVDD may be transmitted to the organic light-emitting diode OLED and a driving current may flow in the organic light-emitting diode OLED.

A gate electrode of the second initialization thin-film transistor T7 may be connected to a next scan line SL+1. A source electrode of the second initialization thin-film transistor T7 may be connected to the pixel electrode of the organic light-emitting diode OLED. A drain electrode of the second initialization thin-film transistor T7 may be connected to the initialization voltage line VL. The second initialization thin-film transistor T7 may be turned on in response to a next scan signal Sn+1 received through the next scan line SL+1 and may be configured to initialize the pixel electrode of the organic light-emitting diode OLED.

FIG. 5B illustrates the case where the first initialization thin-film transistor T4 and the second initialization thin-film transistor T7 are respectively connected to the previous scan line SL−1 and the next scan line SL+1. However, embodiments are not limited thereto. According to another embodiment, both of the first initialization thin-film transistor T4 and the second initialization thin-film transistor T7 may be connected to the previous scan line SLn−1 and driven according to the previous scan signal Sn−1.

The other electrode of the storage capacitor Cst may be connected to the driving voltage line PL. One electrode of the storage capacitor Cst may be connected to the gate electrode of the driving thin-film transistor T1, the drain electrode of the compensation thin-film transistor is T3, and the source electrode of the first initialization thin-film transistor T4.

An opposite electrode (for example, a cathode) of the organic light-emitting diode OLED may receive the common voltage ELVSS. The organic light-emitting diode OLED may emit light by receiving a driving current from the driving thin-film transistor T1.

The pixel circuits PC are not limited to the pixel circuits PC having the numbers and circuit designs of the thin-film transistors and the storage capacitors described above with reference to FIGS. 5A and 5B, and may be variously modified.

Figure 6:
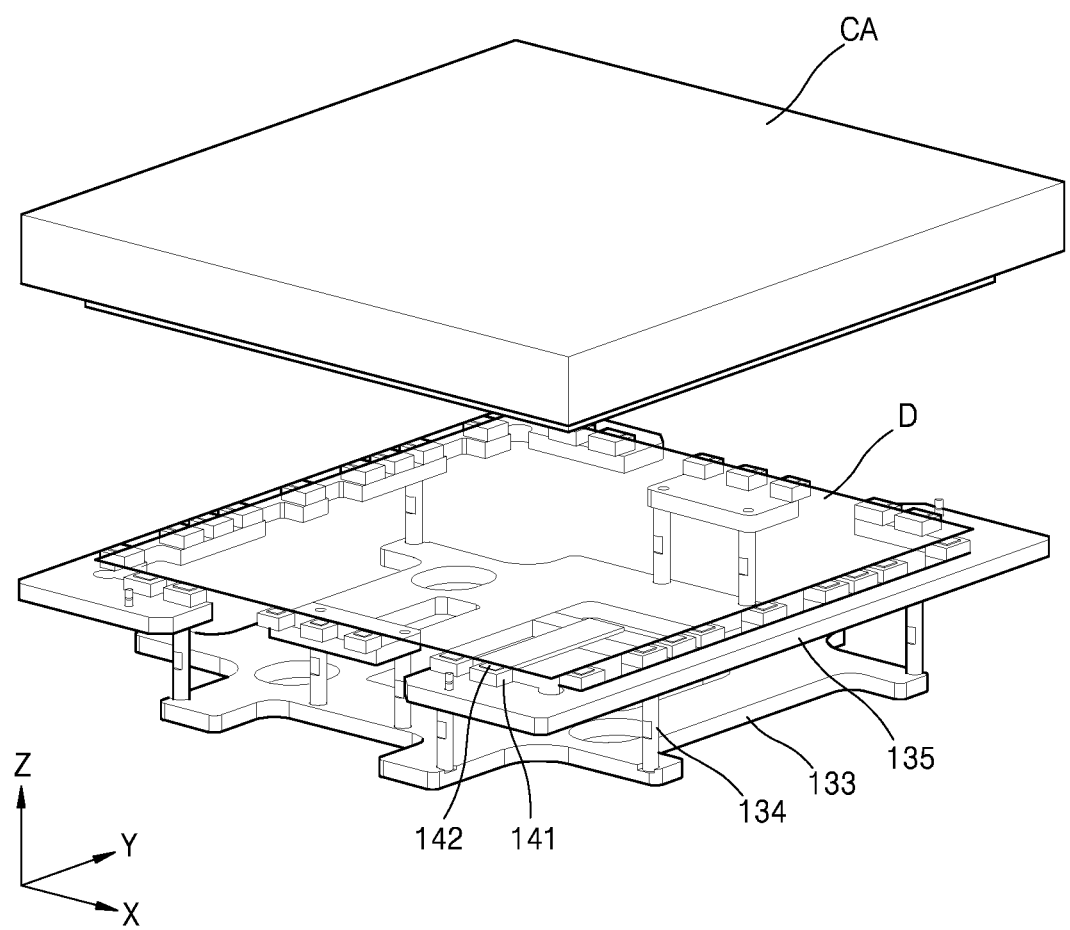
FIG. 6 is a perspective view of an embodiment of a portion of the first processing unit of FIG. 2.

FIG. 6 is a perspective view of an embodiment of a portion of the first processing unit 100 of FIG. 2. FIG. 7 is a cross-sectional perspective view of an embodiment of the mounting portion 142 of FIG. 6. FIG. 8 is a cross-sectional view of the mounting portion 142 of FIG. 7.

Referring to FIGS. 6 through 8, the mounting portion 142 may include a first mounting portion 142-1, a second mounting portion 142-2, and a first stopper 142-3. The first mounting portion 142-1 and the second mounting portion 142-2 may be connected to each other to have a step difference such that they have different heights. In this case, because the first mounting portion 142-1 and the second mounting portion 142-2 are arranged at different heights from each other, when the mounting portion 142 moves, only the second mounting portion 142-2 may contact the carrier CA. In this case, an end of the display substrate D may be mounted on the first mounting portion 142-1. The end (or an edge) of the display substrate D may be supported by the first mounting portion 142-1 in contact with an upper surface of the first mounting portion 142-1. The first stopper 142-3 may project from the mounting portion 142 in a direction (e.g., the X-axis direction) that is different from a height direction (e.g., the Z-axis direction) of the mounting portion 142. In this case, the first stopper 142-3 may project in the direction that is perpendicular to the height direction of the mounting portion 142. The first stopper 142-3 may be received in the housing 141 and may linearly move therein relative to the housing 141. The movement of the first stopper 142-3 may be selectively limited by contacting a first blocking portion 141-1 arranged at an end of the housing 141, so as to prevent the detachment of the mounting portion 142.

Referring to FIG. 2, the driving force generating portion 131 may be arranged outside the first processing chamber 110. The driving force generating portion 131 may be formed in various forms. For example, the driving force generating portion 131 may include a cylinder having a piston operated by fluid pressure to generate the force required for linear movement. According to another embodiment, the driving force generating portion 131 may include a motor, a spur gear connected to the motor, and a rack gear connected to the spur gear. According to another embodiment, the driving force generating portion 131 may also include a linear motor. The driving force generating portion 131 is not limited to the examples described above. The driving force generating portion 131 may include all devices and structures that are connected to the first and second connection portions 132 and 134 or the first and second supporting portions 133 and 135 for linearly moving the first and second connection portions 132 and 134 or the first and second supporting portions 133 and 135. However, hereinafter, for convenience of explanation, a case in which the driving force generating portion 131 includes a cylinder will be mainly described in detail.

With respect to the driving force generating portion 131, one driving force generating portion or two or more driving force generating portions may be provided. However, hereinafter, for convenience of explanation, a case in which one driving force generating portion 131 is provided will be mainly described in detail.

Referring to FIGS. 2 and 6, the first and second connection portions 132 and 134 may be connected with the driving force generating portion 131 or the first and second supporting portions 133 and 135. As shown in FIG. 2, the first connection portion 132 may be connected between the driving force generating portion 131 and the first supporting portion 133. Also, as shown in FIGS. 2 and 6, the second connection portion 134 may be connected between the first supporting portion 133 and the second supporting portion 135. For example, at least one of the first connection portion 132 and the second connection portion 134 may be provided in plural. The plurality of first connection portions 132 may be spaced apart from each other. In this case, the plurality of first connection portions 132 may be directly connected with the driving force generating portion 131, as such the first connection portions 132 may transfer a driving force generated from the driving force generating portion 131 to the second connection portion 134 and the first and second supporting portions 133 and 135. According to an embodiment, the plurality of first connection portions 132 may be connected with one driving force generating portion 131. According to another embodiment, one or more of the plurality of first connection portions 132 may be connected with one driving force generating portion 131 and another of the plurality of first connection portions 132 may be connected with another driving force generating portion 131. According to another embodiment, the first connection portions 132 may be connected with the driving force generating portions 131, respectively. The plurality of second connection portions 134 may be spaced apart from each other. Hereinafter, for convenience of explanation, a case in which the first connection portion 132 is provided in plural, and the plurality of first connection portions 132 are connected to one driving force generating portion 131 will be mainly described in detail.

Referring to FIGS. 2 and 6, the first supporting portion 133 may be between the first connection portion 132 and the second connection portion 134, and the second supporting portion 135 may be between the second connection portion 134 and the mounting portion 142.

As shown in FIG. 6, the first supporting portion 133 may be formed as a plate. According to an embodiment, one first supporting portion 133 may be provided and may be connected to the plurality of first connection portions 132 and the plurality of second connection portions 134. Here, a hole may be formed in the central portion of the first supporting portion 133. According to another embodiment, the first supporting portion 133 may be provided in plural, wherein one of the plurality of first supporting portions 133 may be connected to one or more of the plurality of first connection portions 132 and one or more of the plurality of second connection portions 134, and another one of the plurality of first supporting portions 133 may be connected to another one or more of the plurality of first connection portions 132 and another one or more of the plurality of second connection portions 134.

The second supporting portion 135 may be connected with the second connection portion 134. The second supporting portion 135 may be formed as a frame. In this case, the second supporting portions 135 may be provided in plural, wherein one or more of the plurality of second supporting portions 135 may be connected to one or more second connection portions 134, and the other one or more of the plurality of second supporting portions 135 may be connected to the other one or more second connection portions 134. In this case, the second supporting portions 135 may be separate from each other and may be connected to and supported by the first supporting portions 133 through the second connection portions 134.

Referring to FIGS. 7 and 8, the spring 144 may be accommodated in the guide 146. Here, as described above, the spring 144 may have various shapes. For example, the spring 144 may have a bar shape including an elastic material, such as silicon, rubber, etc. According to another embodiment, the spring 144 may include a coil spring. However, hereinafter, for convenience of explanation, a case in which the spring 144 includes a coil spring will be mainly described in detail.

As shown in FIG. 6, the housing 141 may be arranged on the second supporting portion 135. The housing 141 may be fastened on the second supporting portion 135 as shown in FIGS. 7 and 8. The housing 141 may have a space inside the housing 141 and the mounting portion 142 may be accommodated in this space so as to be capable of performing a linear movement. In this case, the first stopper 142-3 of the mounting portion 142 may be blocked at an end of the housing 141. That is, a length in which the mounting portion 142 projects in a direction toward a portion of the housing 141 may be less than a distance between an end of the first stopper 142-3 and an end of another first stopper 142-3. In this case, the mounting portion 142 may not be withdrawn from the housing 141.

Referring to FIGS. 7 and 8, the guide 146 may be arranged in the housing 141. The guide 146 may be integrally formed with the housing 141 or may be integrally formed with the second supporting portion 135. According to another embodiment, the guide 146 may be separately formed from the housing 141 or the second supporting portion 135 and may be coupled to the housing 141 or the second supporting portion 135. In this case, the guide 146 may be formed in a direction, and thus, may guide a linear movement of the plunger 143. Also, the spring 144 may be arranged in the guide 146, and thus, when the spring 144 is transformed, the guide 146 may prevent the spring 144 not only from being transformed in a length direction, but also from being twisted or distorted.

Referring to FIGS. 7 and 8, the plunger 143 may be received in the guide 146 and may move along with the mounting portion 142. Also, the plunger 143 may be received in the mounting portion 142 and may contact an inner surface of the mounting portion 142. Here, an outer surface 143' of the plunger 143, i.e., the outer surface contacting the inner surface 142' of the mounting portion 142, may include a curved surface. For example, the plunger 143 may include an balance adjusting body 143-1 having a generally hemispherical shape, a generally oval shape, or a generally cylindrical shape. The balance adjusting body 143-1 has a portion 143' contacting the inner surface 142' of the mounting portion 142, wherein the portion has various shapes, for example, a shape of a curved surface, such as a generally hemispherical shape. Also, the plunger 143 may include a second stopper 143-2 formed to project from the balance adjusting body 143-1. The second stopper 143-2 may project in a direction substantially perpendicular to a length direction of the balance adjusting body 143-1. In this case, the second stopper 143-2 may move along an inner surface 146' of the guide 146. The guide 146 may include a second blocking portion 146-1 having a bent end to limit movement of the second stopper 143-2. Thus, when the plunger 143 moves along with the guide 146, the plunger 143 may not be detached from the guide 146 due to the force of the spring 144.

The mounting portion 142 described above may be linearly moved according to the operation of the driving portion. For example, when the driving portion allows the mounting portion 142 to upward, the mounting portion 142 may contact the carrier CA. The mounting portion 142 may be moved relatively nearer to the carrier CA according to an operation of the driving portion, and a portion of the mounting portion 142 projecting from the housing 141 may be moved into the housing 141. In this case, the length of the spring 144 may be decreased.

When the mounting portion 142 is inserted into the housing 141 as described above, the display substrate D may not be excessively pushed by a force applied from a surface of the carrier CA, according to the movement of the mounting portion. Thus, damage to the display substrate D due to the carrier CA may be prevented.

Also, when force is applied to the mounting portion 142 by the carrier CA, an upper surface of the second mounting portion 142-2 and a lower surface of the carrier CA should contact each other due to the spring 144.

In detail, the mounting portion 142 may be inserted into the housing 141 such that there is a predetermined space between the mounting portion 142 and the housing 141. Thus, when the angle formed by the upper surface of the second mounting portion 142-2 and the lower surface of the carrier CA is not 0 degrees, the position of the mounting portion 142 may be partially changed in the housing 141 such that the entire upper surface of the second mounting portion 142-2 completely contacts the lower surface of the carrier CA. In this case, if the inner surface 142' of the mounting portion 142 directly contacts the spring 144 without the plunger 143, the spring 144 may not press the mounting portion 142 to the tilted carrier CA due to a shape of an end of the spring 144 and so on. However, according to embodiment, the plunger 143 may be arranged between the spring 144 and the mounting portion 142 so as to support the mounting portion 142 to allow a tilting movement or a pan movement in various directions, i.e., x and y directions in FIG. 8.

Thus, in this case, the plunger 143 may allow the upper surface of the second mounting portion 142-2 to completely contact the lower surface of the carrier CA, even when the upper surface of the second mounting portion 142-2 and the lower surface of the carrier CA are not parallel to each other.

Figure 9:
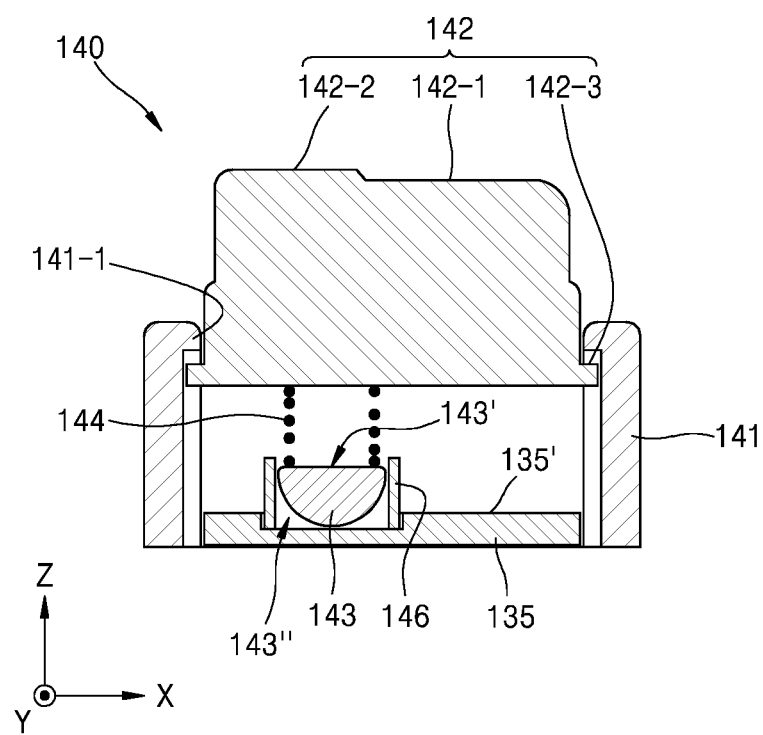
FIG. 9 is a cross-sectional view of another embodiment of the mounting portion of FIG. 6.

FIG. 9 is a cross-sectional view of another embodiment of the mounting portion 142 of FIG. 6.

Referring to FIG. 9, the mounting portion 142 may be arranged in the housing 141 as described above with reference to FIG. 8. The guide 146 may be arranged in the housing 141, and the spring 144 may be arranged in the guide 146. The mounting portion 142, the housing 141, and the guide 146 are the same or substantially the same as described with reference to FIG. 8, and thus, repetitive descriptions will be omitted to avoid redundancy.

The plunger 143 may be received in the guide 146 and may contact the spring 144. The plunger 143 may contact a lower surface of the housing 141 or as shown in FIG. 9, an upper surface 135' of the second supporting portion 135. In particular, a surface 143" of the plunger 143, the surface 143" contacting the lower surface of the housing 141 or the upper surface 135' of the second supporting portion 135, may be formed to be curved. For example, the plunger 143 may have a generally spherical shape, a generally hemispherical shape, a a generally oval shape, or a shape cylindrical shape, including a portion having a shape curved surface.

The spring 144 may be arranged on an upper surface 143''' of the plunger 143, and the surface on which the spring 144 is arranged may be formed to be linear or curved.

In this case, when the second mounting portion 142-2 contacts the carrier CA, the plunger 143 may adjust the force toward the carrier CA, the force being applied by the spring 144 to the mounting portion 142. That is, when the spring 144 may not press the mounting portion 142 in a direction perpendicular to the lower surface of the carrier CA, such as when a portion of the spring 144, the portion contacting the inner surface of the mounting portion 142, does not have a flat torsion, when the spring 144 does not form a straight line, etc., the plunger 143 may freely rotate so that the spring 144 may properly press the mounting portion 142 toward the carrier CA. Also, when the second mounting portion 142-2 contacts the carrier CA and performs a tilting movement or a pan movement, the spring 144 may also move along with the mounting portion 142.

Thus, the second mounting portion 142-2 may completely contact the lower surface of the carrier CA.

Figure 10:
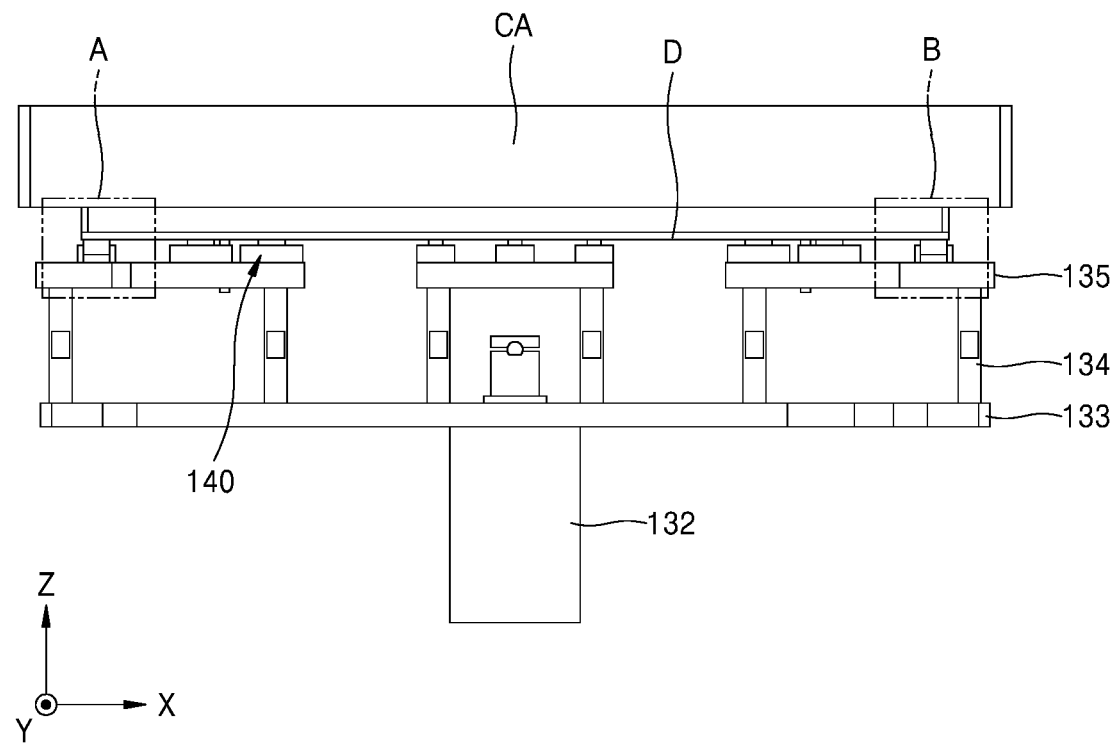
FIG. 10 is a front view illustrating an operation of a portion of the first processing unit of FIG. 2.
Figure 11:
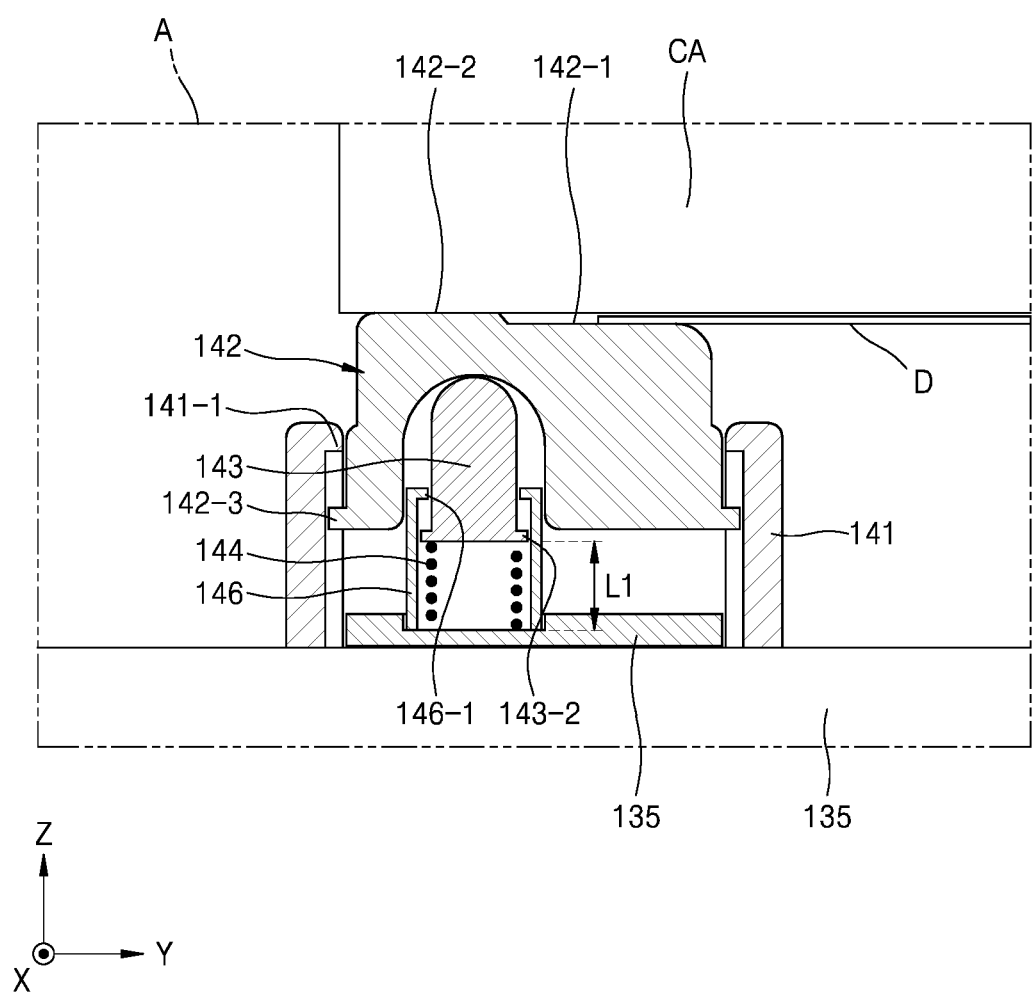
FIG. 11 is an enlarged cross-sectional view of region A of FIG. 10.

FIG. 10 is a front view illustrating an operation of a portion of the first processing unit of FIG. 2. FIG. 11 is an enlarged cross-sectional view of region A of FIG. 10 and FIG. 12 is an enlarged cross-sectional view of region B of FIG. 10.

Figure 12:
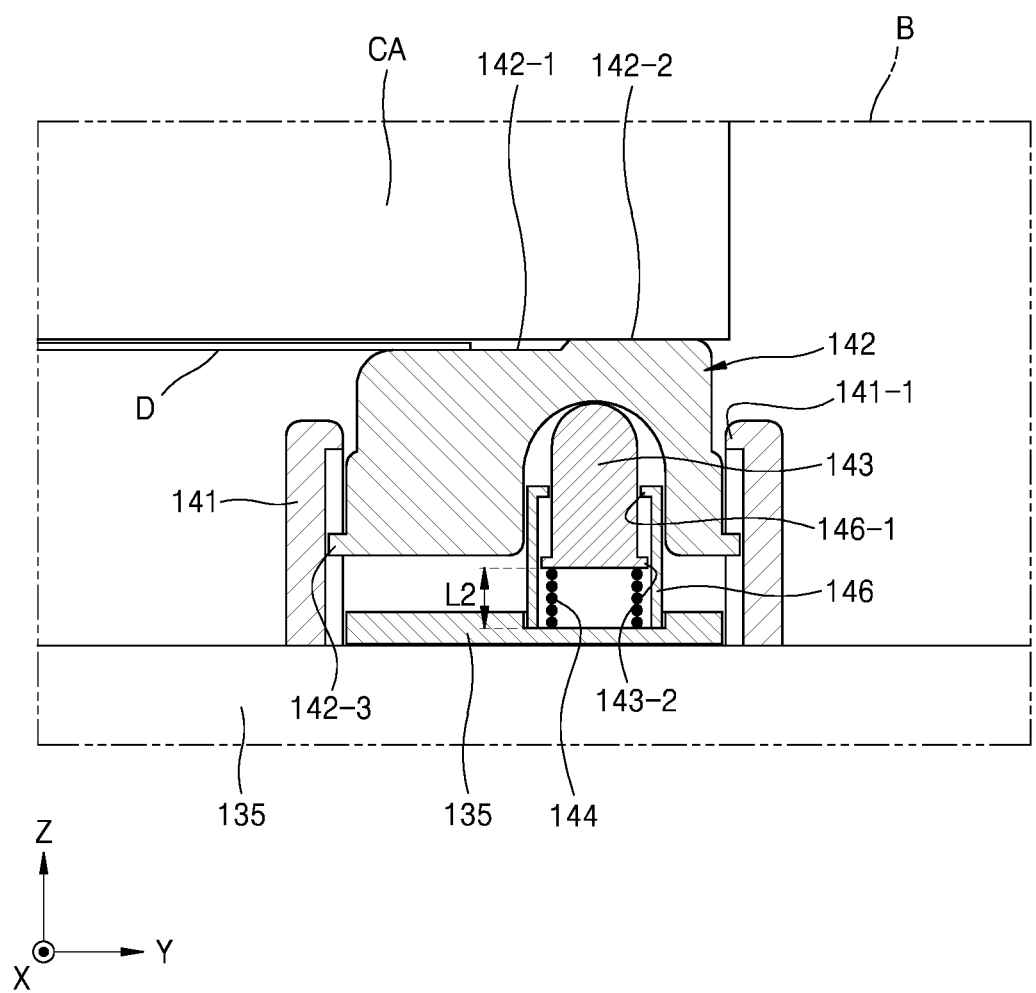
FIG. 12 is an enlarged cross-sectional view of region B of FIG. 10.

Referring to FIGS. 10, 11, and 12, when the display substrate D is connected to the carrier CA and the driving generating portion 131 operates, the first connection portion 132, the first supporting portion 133, the second connection portion 134, and the second supporting portion 135 may linearly move. In detail, when the driving force generating portion 131 operates, the display substrate D mounted on the mounting portion 142 may be moved toward the carrier CA or away from the carrier CA.

Specifically, when the display substrate D is moved toward the carrier CA, the display substrate D may be mounted on and supported by the first mounting portion 142-1. Here, in order not to damage various layers formed on the display substrate D, an edge area of the display substrate D may be arranged on the first mounting portion 142-1.

When the driving force generating portion 131 operates so that the mounting portion 142 moves, the second mounting portion 142-2 may contact the carrier CA. The pressure in the first processing chamber 110 illustrated in FIG. 2 may correspond to a vacuum state or a state similar thereto, and due to a direct weight of the display substrate D, at least one of the first supporting portion 133 and the second supporting portion 135 may be deformed or a portion of at least one of the first supporting portion 133 and the second supporting portion 135 may sag.

In this case, at least one of the plurality of mounting portions 142 may be arranged at a different height from the others of the plurality of mounting portions 142. That is, the distance between an upper surface of the second mounting portion 142-2 of at least one of the plurality of mounting portions 142 and the lower surface of the carrier CA may be different from the distance between the upper surface of the second mounting portions 142-2 of the others of the plurality of mounting portions 142 and the lower surface of the carrier CA. For example, the distance between an upper surface of the second mounting portion 142-2 arranged at region A of FIG. 10 and the lower surface of the carrier CA may be different from the distance between an upper surface of the second mounting portion 142-2 arranged at region B of FIG. 10 and the lower surface of the carrier CA. Hereinafter, for convenience of explanation, a case in which the distance between the upper surface of the second mounting portion 142-2 arranged at region A of FIG. 10 and the lower surface of the carrier CA is greater than the distance between the upper surface of the second mounting portion 142-2 arranged at region B of FIG. 10 and the lower surface of the carrier CA will be mainly described in detail.

In this case, when the driving force generating portion 131 operates to move the display substrate D upwardly, the second mounting portion 142-2 arranged at region A may contact the carrier CA after than the second mounting portion 142-2 arranged at region B contacts the carrier CA.

When the driving force generating portion 131 continually ascends, at least one of the plurality of mounting portions 142 may contact the carrier CA earlier, and the others of the plurality of mounting portions 142 may contact the carrier CA later.

The mounting portion 142 earlier contacting the carrier CA may be forced by the carrier CA according to an operation of the driving force generating portion 131 into the housing 141. Also, in this case, the spring 144 arranged below the mounting portion 142 may be compressed.

Thereafter, when the driving force generating portion 131 continually operates, the other mounting portions 142 may sequentially contact the carrier CA, and accordingly, the mounting portions 142 may be inserted into the accommodating portions 141, respectively.

When the second mounting portions 142-2 of all of the mounting portions 142 contact the carrier CA as described above, the display substrate D may be arranged to face the carrier CA. Specifically, in this case, the mounting portions 142 may be inserted into the accommodating portions 141 by different degrees. That is, according to the location, the length of the compressed spring 144 may be different. For example, a first length L1 of the compressed spring 144 arranged at region A may be greater than a second length L2 of the compressed spring 144 arranged at region B. Thus, the length in which the mounting portion 142 arranged at region A is inserted into the housing 141 may be less than the length in which the mounting portion 142 arranged region B is inserted into the housing 141.

In this case, the force of the carrier CA may not be directly applied to the display substrate D. In detail, the display substrate D may be mounted on the first mounting portion 142-1 of each of the mounting portions 142, and the upper surface of the second mounting portion 142-2 and the upper surface of the first mounting portion 142-1 are arranged at different heights to have a step difference, and thus, even when the upper surface of the second mounting portion 142-2 contacts the carrier CA, the display substrate D mounted on the first mounting portion 142-1 does not directly contact the carrier CA, or even when the display substrate D mounted on the first mounting portion 142-1 directly contacts the carrier CA, the carrier CA may not apply an excessive force to the display substrate D.

Specifically, with respect to this aspect, when the mounting portion 142 is flat surface without having the first mounting portion 142-1 and the second mounting portion 142-2 having different heights due to a step difference, as described above, when the mounting portion 142 ascends, the display substrate D may receive a force at the same time when the carrier CA receives the force by the mounting portion 142. In this case, a plurality of mounting portions supporting the display substrate D may have different heights from each other, and when the plurality of mounting portions ascend, the display substrate D may contact the carrier CA earlier. In this case, when an elastic portion is arranged in each mounting portion, the lengths by which the elastic portions are compressed in the mounting portions may be different from each other, and thus, the magnitudes of the force applied from the mounting portions to the display substrate D may be different from each other. In this case, due to the force applied by one or more of the plurality of mounting portions, cracks, etc. may occur to the display substrate, etc. and the display substrate may be damaged.

However, when the mounting portion 142 includes the first mounting portion 142-1 and the second mounting portion 142-2, as described above, the second mounting portion 142-2 may contact the carrier CA earlier, and thus, the mounting portions 142 may be prevented from applying an excessive force to the display substrate D, and even when the mounting portions 142 are arranged at different heights, the mounting portions 142 may stably support the display substrate D and minimize or prevent damage to the display substrate D.

When the second mounting portions 142-2 of all of the mounting portions 142 contact the carrier CA, the carrier CA may be connected to the display substrate D. In this case, the substrate 10 illustrated in FIG. 4B may be arranged on the carrier CA, and layers (for example, one or more of the buffer layer 11, the circuit layer PCL, and the display element layer EDL) on the substrate 10 may be arranged in an opposite direction to the carrier CA. Thereafter, when the driving force generating portion 130 operates to allow the mounting portion 142 to descend, the mounting portion 142 may be separated from the display substrate D. Thereafter, when all of the mounting portions 142 are separated from the display substrate D, the carrier CA may move the display substrate D to other processing units.

Apparatus and methods of manufacturing display apparatus according to the principles and embodiments of the invention may minimize the damage to the substrate when the substrate is moved and/or may minimize product (i.e., the display apparatus manufactured by the apparatus of FIG. 1) defects.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display apparatus using a support having a first surface on which a display substrate is mounted; and a second surface projecting upwardly from the first surface to selectively contact a carrier for the display substrate, the method comprising the steps of:
    locating the carrier in a chamber;
    linearly moving the support to position the display substrate near but not in contact with the carrier in the chamber;
    contacting the second surface of the support against the carrier;
    linearly moving the support such that a part of the display substrate contacts the carrier.

2. The method of claim 1, wherein further comprising the step of maintaining a vacuum in the chamber.

3. The method of claim 1, further comprising the step of linearly moving the support relative to an accommodating portion.

4. The method of claim 1, further comprising the step of tilting the support when the support contacts the carrier.

5. The method of claim 1, further comprising the step of positioning an elastic portion between the support and a driver, and positioning a balance adjusting portion contacting the elastic portion between the elastic portion and the support or between the elastic portion and the driver.

6. The method of claim 5, further comprising the step of contacting the support or the driver with a curved surface formed on a portion of the balance adjusting portion, the portion contacting the support or the driver.

7. The method of claim 5, wherein the support comprises a plurality of mounting portions, and
 further comprising the step of connecting the plurality of mounting portions to the driver to simultaneously move the plurality of mounting portions.

8. The method of claim 7, wherein, when the plurality of mounting portions contact the carrier, one of the plurality of mounting portions moves a first distance and another of the plurality of mounting portions moves a second distance different from the first distance.

9. The method of claim 7, further comprising the step of separating the mounting portion and the part of the display substrate from being in contact with each other by operating the driver.

\* \* \* \* \*